United States Patent [19]
Gottshall et al.

[11] Patent Number: 5,606,273
[45] Date of Patent: Feb. 25, 1997

[54] ZERO CROSSING DETECTOR CIRCUIT

[75] Inventors: Paul C. Gottshall, Washington; Long T. Le, Peoria, both of Ill.

[73] Assignee: Caterpillar Inc., Peoria, Ill.

[21] Appl. No.: 625,264

[22] Filed: Mar. 28, 1996

[51] Int. Cl.$^6$ .............................. H03K 5/153; H03L 5/00
[52] U.S. Cl. ................... 327/79; 327/65; 327/307
[58] Field of Search ......................... 327/77, 78, 79, 327/65, 66, 67, 307, 374, 89, 560–563, 362

[56] References Cited

U.S. PATENT DOCUMENTS

| | | | |
|---|---|---|---|
| 4,634,892 | 1/1987 | Isbell et al. | 327/65 |
| 5,028,815 | 7/1991 | Van De Plassche | 327/65 |
| 5,214,319 | 5/1993 | Abdi | 327/78 |

*Primary Examiner*—Toan Tran
*Attorney, Agent, or Firm*—David M. Masterson

[57] ABSTRACT

In one aspect of the present invention, a zero crossing detecting circuit is disclosed. The circuit includes a first comparator having an inverting and non-inverting input connected to an input signal. The non-inverting input of the first comparator is further connected to the first comparator output to provide a feed forward path. A second comparator is additionally included having an output connected to the first comparator inverting input. This provides the inverting input of the first comparator with a reference voltage that is substantially equal to that of the first comparator non-inverting input; thereby, providing the first comparator with balanced inputs.

4 Claims, 1 Drawing Sheet

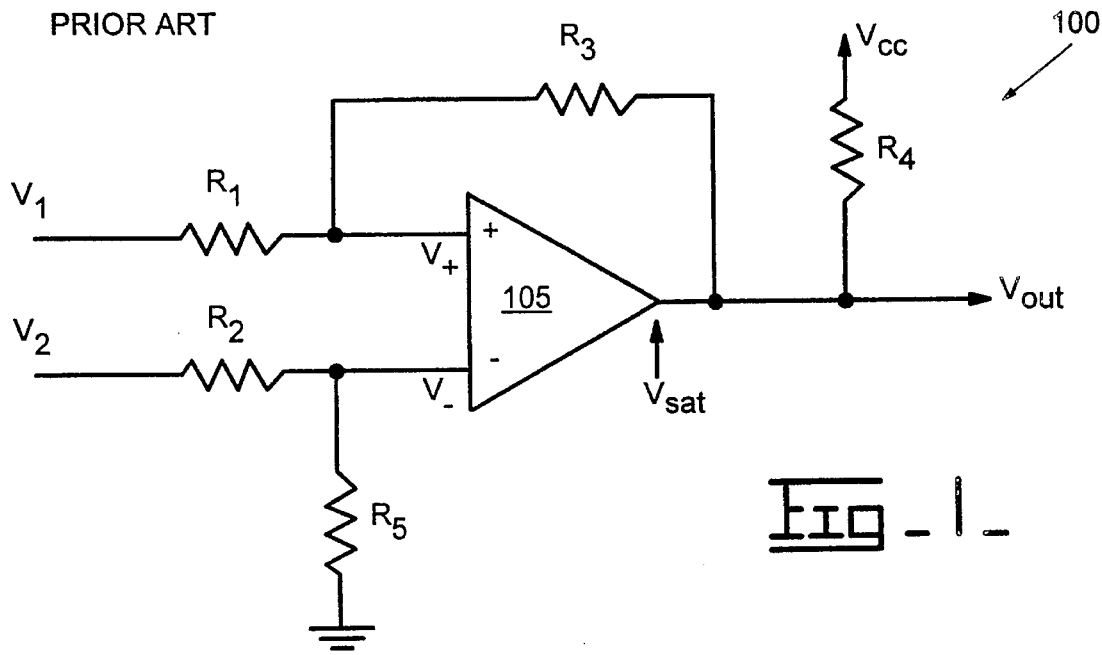
Fig-1-
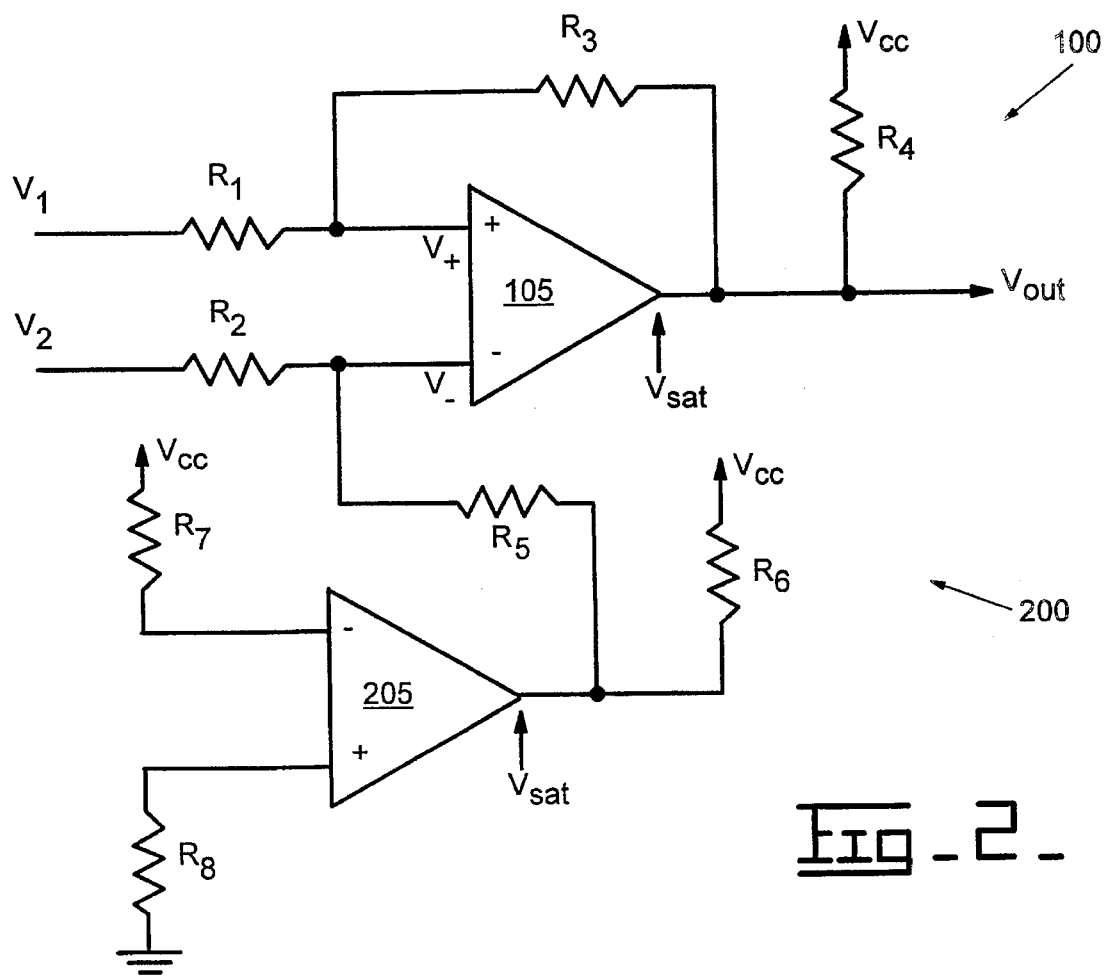
Fig-2-

ZERO CROSSING DETECTOR CIRCUIT

TECHNICAL FIELD

This invention relates generally to a zero crossing detector circuit and, more particularly, to a circuit that includes a comparator being configured in a difference amp configuration that has balanced inputs.

BACKGROUND ART

Shown in FIG. 1 is a prior art zero crossing detector circuit. The illustrated circuit consists of an open-collector comparator circuit which is configured in a difference amp configuration. The zero crossing detector circuit generates an output square wave from an input sinusoidal wave. For example, the input sinusoidal wave is delivered to $V_1$, which imposes a voltage on the non-inverting input $V_+$ via $R_1$, and to $V_2$, which imposes a voltage on the inverting input $V_-$ via voltage divider $R_2/R_5$. When $V_+$ is greater than $V_-$ the circuit output is HIGH ($V_{cc}$), and when $V_+$ is greater than $V_-$ the circuit output is LOW (the saturation voltage of the comparator). Most importantly, however, the circuit detects the point in time when the input voltage makes a transition from a higher value to a lower value—referenced to zero volts. However, because the inputs $V_+$ and $V_-$ are imbalanced, the circuit does not satisfactorily detect when the input signal crosses zero.

The present invention is directed to overcoming one or more of the problems as set forth above.

DISCLOSURE OF THE INVENTION

In one aspect of the present invention, a zero crossing detecting circuit is disclosed. The circuit includes a first comparator having an inverting and non-inverting input connected to an input signal. The non-inverting input of the first comparator is further connected to the first comparator output to provide a feed forward path. A second comparator is additionally included having an output connected to the first comparator inverting input. This provides the inverting input of the first comparator with a reference voltage that is substantially equal to that of the first comparator non-inverting input; thereby, providing the first comparator with balanced inputs.

BRIEF DESCRIPTION OF THE DRAWINGS

For a better understanding of the present invention, reference may be made to the accompanying drawings in which:

FIG. 1 shows a prior art zero crossing detector circuit; and

FIG. 2 show a zero crossing detector circuit associated with the present invention.

BEST MODE FOR CARRYING OUT THE INVENTION

As explained above, the zero crossing detector circuit 100 of FIG. 1 includes a first comparator 105 being configured in a difference amp configuration. Preferably, $R_1=R_2$ and $R_3=R_5$ so that when $V_1$ is greater than $V_2$, $V_{out}$ will go HIGH ($V_{cc}$). Alternately, when $V_1$ is less than $V_2$, $V_{out}$ will go LOW ($V_{sat}$). However, because the inputs $V_+$ and $V_-$ are not equally balanced, the accuracy of the circuit 100 is unsatisfactory. The voltage values for the inputs are shown below:

$$V_+ = (V_1 - V_{sat})(R_3/(R_1+R_3)) + V_{sat}$$

$$V_- = V_2 * (R_5/(R_2+R_5))$$

As shown by the above equations, the imbalance is due to the non-inverting input $V_+$ being referenced to the saturation voltage, while the inverting input $V_-$ is referenced to ground; thereby, resulting in an imbalance of approximately 0.2 volts.

Thus, a novel way to compensate for the imbalanced inputs is to equivalently offset the $R_2/R_5$ voltage divider with the saturation voltage of a similarly biased comparator. Referring now to FIG. 2, the preferred embodiment 200 of the present invention is illustrated. As shown, a second comparator 205 having an output is connected to the $V_-$ input of the first comparator 105 to provide the $V_-$ input with a voltage reference of $V_{sat}$ of the second comparator 205. The inverting input $V_-$ of the second comparator 205 is connected to source voltage $V_{cc}$ via resistor $R_7$, while the non-inverting input $V_+$ is connected to ground via resistor $R_8$. Note, $R_7$ should have the same value as $R_8$. Thus, now the inverting and non-inverting input of the first comparator 105 are referenced to approximately the same voltage; thereby, providing for greater accuracy.

To insure that the saturation voltage of the second comparator 205 is substantially the same as the first comparator 105, the first and second comparators should be biased similarly. Thus, $R_4$ should have the same value as $R_6$ to similarly bias the output transistors of both comparators. However, because environmental changes in temperature effect the situation voltage of the comparators, it is advantageous to have the second comparator 205 be from the same integrated circuit package as the first comparator 105 to insure that the saturation voltages of the comparators are equally affected by temperature. Thus, because the input voltage of the inverting input $V_-$ of the first comparator 105 is now referenced to substantially the same voltage as the non-inverting input $V_+$, the accuracy of detecting when the input voltage crosses zero is greatly increased.

Thus, while the present invention has been particularly shown and described with reference to the preferred embodiment above, it will be understood by those skilled in the art that various additional embodiments may be contemplated without departing from the spirit and scope of the present invention.

INDUSTRIAL APPLICABILITY

Many mechanisms, such as diesel engines for example, have parts which cooperate in time relation to produce optimum performance. Conventional timing methods include attaching transducers to the engine crank or camshaft to generate a timing signal and measuring the period of the timing signal. The preferred embodiment of the present invention is adapted to receive the timing signal, which is produced in sinusoidal form, and convert the sinusoidal signal to a series of reference pulses. For example, as the input signal makes a transition from a high level to a low level, the circuit of the present invention will produce a LOW signal shortly after the input signal crossing zero volts, i.e., when the input signal goes from a positive voltage value to a negative voltage value. Similarly, as the input signal makes a transition from a low level to a high level, the circuit of the present invention will produce a HIGH signal when the input signal crosses zero, i.e., when the input signal goes from a negative voltage value to a positive voltage value.

Other aspects, objects and advantages of the present invention can be obtained from a study of the drawings, the disclosure and the appended claims.

What is claimed is:

1. A zero crossing detecting circuit, comprising:

a first comparator having an inverting input, a non-inverting input and an output, the non-inverting input being connected to the output to provide a feed forward path, wherein the inverting and non-inverting input are adapted to receive an input signal the non-inverting input being referenced to a reference voltage, the reference voltage being different from ground; and a second comparator having an inverting input, a non-inverting input and an output, the second comparator output being connected to the first comparator inverting input to provide the inverting input of the first comparator with a reference voltage substantially equal to the reference voltage of the non-inverting input of the first comparator.

2. A circuit, as set forth in claim 1, wherein the outputs of the first and second comparators are connected to a common source voltage via resistors of the same resistance value.

3. A circuit, as set forth in claim 2, wherein the first and second comparators are from the same integrated circuit package.

4. A circuit, as set forth in claim 3, wherein the inverting input of the second comparator is connect to the source voltage and the non-inverting input is connected to ground.

* * * * *